(12) United States Patent
Chung

(10) Patent No.: US 10,305,062 B2
(45) Date of Patent: May 28, 2019

(54) LIGHTING ASSEMBLY AND LIGHTING DEVICE

(71) Applicant: BOE TECHNOLOGY GROUP CO., LTD., Beijing (CN)

(72) Inventor: Chiehhsing Chung, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/553,706

(22) PCT Filed: Feb. 21, 2017

(86) PCT No.: PCT/CN2017/074252
§ 371 (c)(1),
(2) Date: Aug. 25, 2017

(87) PCT Pub. No.: WO2018/040518
PCT Pub. Date: Mar. 8, 2018

(65) Prior Publication Data
US 2018/0240998 A1    Aug. 23, 2018

(30) Foreign Application Priority Data

Sep. 5, 2016 (CN) .......................... 2016 1 0801594

(51) Int. Cl.
*H01L 51/52* (2006.01)
*H01L 21/52* (2006.01)

(52) U.S. Cl.
CPC .......... *H01L 51/5209* (2013.01); *H01L 21/52* (2013.01); *H01L 51/5203* (2013.01); *H01L 51/5225* (2013.01); *H01L 51/5237* (2013.01); *H01L 2251/5361* (2013.01)

(58) Field of Classification Search
None
See application file for complete search history.

(56) References Cited

U.S. PATENT DOCUMENTS

| 2012/0086025 | A1 | 4/2012 | Mo |
| 2013/0200358 | A1 | 8/2013 | Hartmann et al. |
| 2014/0070172 | A1 | 3/2014 | Li et al. |
| 2015/0295202 | A1 | 10/2015 | Ma |
| 2016/0118622 | A1* | 4/2016 | Krummacher ...... H01L 51/5203 257/99 |

(Continued)

FOREIGN PATENT DOCUMENTS

| CN | 102315353 A | 1/2012 |
| CN | 102332521 A | 1/2012 |

(Continued)

OTHER PUBLICATIONS

First Office Action for Chinese Patent Application No. 201610801594.5 dated Aug. 2, 2017.

(Continued)

*Primary Examiner* — Michelle Mandala
(74) *Attorney, Agent, or Firm* — Calfee, Halter & Griswold LLP

(57) ABSTRACT

Disclosed is a lighting assembly including a substrate, at least one electrode region, and a light emitting region. The light emitting region surrounds at least one surrounded electrode region of the at least one electrode region. Also disclosed is a lighting device including the lighting assembly.

20 Claims, 8 Drawing Sheets

(56) References Cited

U.S. PATENT DOCUMENTS

2016/0126486 A1* 5/2016 Scharner ............ H01L 51/5203
257/40

FOREIGN PATENT DOCUMENTS

| CN | 103250266 A | 8/2013 |
| CN | 103681731 A | 3/2014 |
| CN | 103702467 A | 4/2014 |
| CN | 106229422 A | 12/2016 |
| JP | 2000296636 A | 10/2000 |
| JP | 2006253302 A | 9/2006 |

OTHER PUBLICATIONS

Second Office Action for Chinese Patent Application No. 201610801594.5 dated Dec. 26, 2017.
Search Report for International Application No. PCT/CN2017/074252 dated May 25, 2017.
Third Office Action for Chinese Patent Application No. 201610801594.5 dated Jun. 28, 2018.

* cited by examiner

LIGHTING ASSEMBLY AND LIGHTING DEVICE

CROSS-REFERENCE TO RELATED APPLICATIONS

The present application is the U.S. national phase entry of PCT/CN2017/074252, with an international filing date of Feb. 21, 2017, which claims the benefit of Chinese Patent Application No. 201610801594.5, filed on Sep. 5, 2016, the entire disclosures of which are incorporated herein by reference.

TECHNICAL FIELD

The present disclosure relates to the field of lighting technology, and more particularly to a lighting assembly and a lighting device.

BACKGROUND

Lighting panels such as display backlights and indoor luminaires have been proposed in which an electroluminescent device such as an organic light emitting diode (OLED) or a quantum dot light emitting diode (QLED) is used as a light source. In a lighting panel based on, for example, an OLED, a transparent electrode of the OLED that is made of an indium tin oxide (ITO) material has a poor electrical conductivity and will lead to a large voltage drop (IR-drop) on the current transmission path. This will cause non-uniformity of the brightness of the OLED lighting panel.

SUMMARY

Embodiments of the present disclosure provide a lighting assembly and a lighting device comprising the lighting assembly to offer more options against one or more of the above-mentioned problems.

According to a first aspect of the present disclosure, a lighting assembly is provided which comprises a substrate having a first surface; at least one electrode region arranged on the first surface, each electrode region comprising at least one of a first external electrode and a second external electrode such that the first surface is provided with at least one first external electrode and at least one second external electrode, the first external electrode and the second external electrode being insulated from each other; and a light emitting region arranged on the first surface and surrounding at least one surrounded electrode region of the at least one electrode region, the light emitting region comprising a first electrode layer, an electroluminescent layer, and a second electrode layer arranged sequentially in a direction away from the substrate, the first electrode layer being electrically connected to the first external electrode, the second electrode layer being electrically connected to the second external electrode.

In some embodiments, the lighting assembly further comprises a first encapsulation region arranged on the first surface and positioned between the at least one surrounded electrode region and the light emitting region; a second encapsulation region arranged on the first surface and surrounding the light emitting region; and an encapsulation structure formed on the first encapsulation region, the light emitting region, and the second encapsulation region to provide encapsulation of the light emitting region.

In some embodiments, the light emitting region occupies a region of the first surface other than the first encapsulation region, the second encapsulation region, and the at least one electrode region.

In some embodiments, the first electrode layer comprises a plurality of individual sub-blocks.

In some embodiments, the plurality of sub-blocks is grouped into at least one block, each block being powered via a respective one of the at least one first external electrode such that powering to each block is individually controllable.

In some embodiments, the second electrode layer comprises a plurality of individual sub-blocks.

In some embodiments, the plurality of sub-blocks is grouped into at least one block, each block being powered via a respective one of the at least one second external electrode such that powering to each block is individually controllable.

In some embodiments, the first electrode layer and the second electrode layer each comprise a plurality of individual sub-blocks.

In some embodiments, the plurality of sub-blocks of the first and second electrode layers are grouped into at least one pair of blocks, each pair of blocks being powered via a respective one of the at least one first external electrode and a respective one of the at least one second external electrode such that powering to each pair of blocks is individually controllable.

In some embodiments, a plurality of the electrode regions is evenly distributed over the first surface.

In some embodiments, a plurality of the electrode regions is arranged such that a pattern formed by the plurality of electrode regions is rotationally symmetric with respect to a center of the first surface.

In some embodiments, the first electrode layer is an anode, and the second electrode layer is a cathode.

In some embodiments, the electroluminescent layer comprises an organic electroluminescent material or a quantum dot material.

According to a first aspect of the present disclosure, a lighting device is provided which comprises the lighting assembly as described in the first aspect.

These and other aspects of the present disclosure will be apparent from and elucidated with reference to the embodiment(s) described hereinafter.

BRIEF DESCRIPTION OF THE DRAWINGS

Further details, features and advantages of the disclosure are disclosed in the following description of exemplary embodiments in connection with the accompanying drawings, in which.

DETAILED DESCRIPTION

Figure 1:
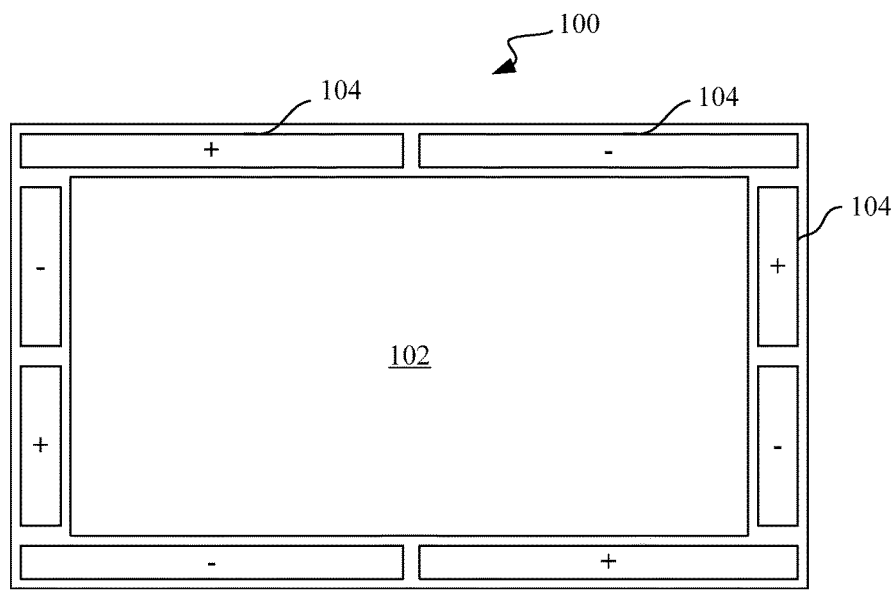
FIG. 1 schematically shows a plan view of a prior art lighting panel.

The disclosure will now be described more fully hereinafter with reference to the accompanying drawings, in which exemplary embodiments of the disclosure are shown. The present disclosure may, however, be embodied in many different forms and should not be construed as being limited to the embodiments set forth herein. Rather, these embodiments are provided such that this disclosure will be thorough and complete, and will fully convey the scope of the disclosure to those skilled in the art. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 schematically shows a plan view of a prior art lighting panel 100. The lighting panel 100 has a light emitting region 102 and a plurality of stripe-shaped external electrodes 104 around the light emitting region 102. This, to a certain extent, improves the non-uniformity of the current distribution due to the poor electrical conductivity of the electrodes in the electroluminescent device. Wider stripe-shaped external electrodes are typically used on a lighting panel having a larger area such that the lighting panel has a peripheral region dedicated to the external electrodes that has a width of, e.g., up to 4 mm.

However, there is still a need for improved brightness uniformity of the lighting panel. Moreover, arranging a peripheral region dedicated to the external electrodes on the lighting panel limits the application of the lighting panel in e.g. a "bezel-less" design.

Figure 2A:
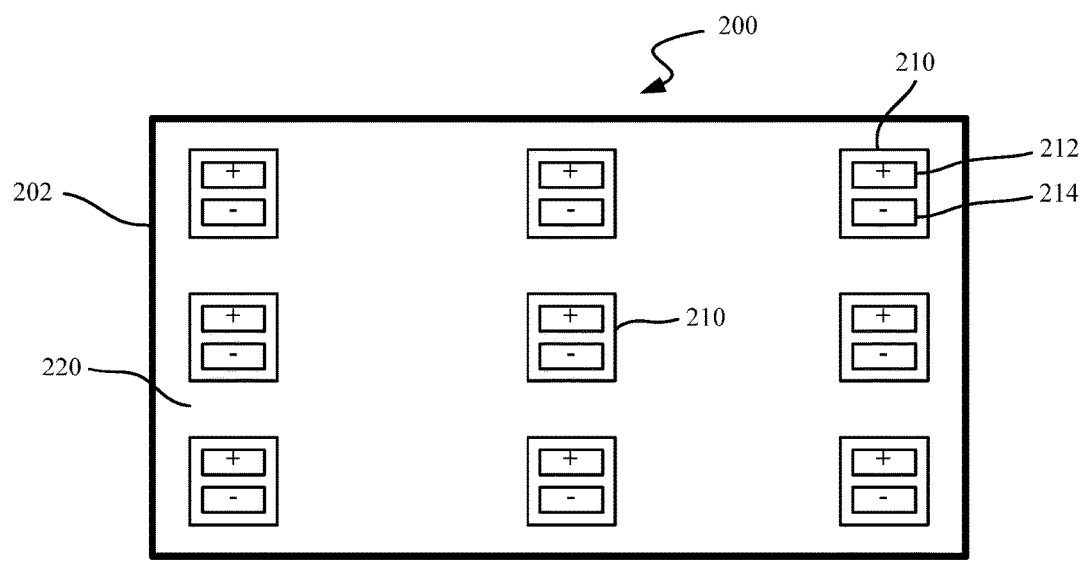
FIG. 2A schematically shows a plan view of a lighting assembly according to an embodiment of the present disclosure.

FIG. 2A schematically shows a plan view of a lighting assembly 200 according to an embodiment of the present disclosure.

Referring to FIG. 2A, the lighting assembly 200 includes a substrate 202, a plurality of electrode regions 210, and a light emitting region 220. The substrate 202 has a first surface that is, for example, a top surface of the substrate 202. A plurality of electrode regions 210 is arranged on the first surface, and each of the electrode regions 210 includes a first external electrode 212 (indicated by "+") and a second external electrode 214 (indicated by "−") that are insulated from each other. The light emitting region 220 is arranged on the first surface and surrounds at least one of the electrode regions 210. In this example, the light emitting region 220 is shown as surrounding all of the electrode regions 210.

In this embodiment, the substrate 202 may be made of a transparent material such as glass or a transparent resin to provide a light transmittance because a second surface (a bottom surface) of the substrate 202 that is opposite to the first surface where the electrode regions 210 are arranged is typically used as a light-emitting surface.

Figure 2B:
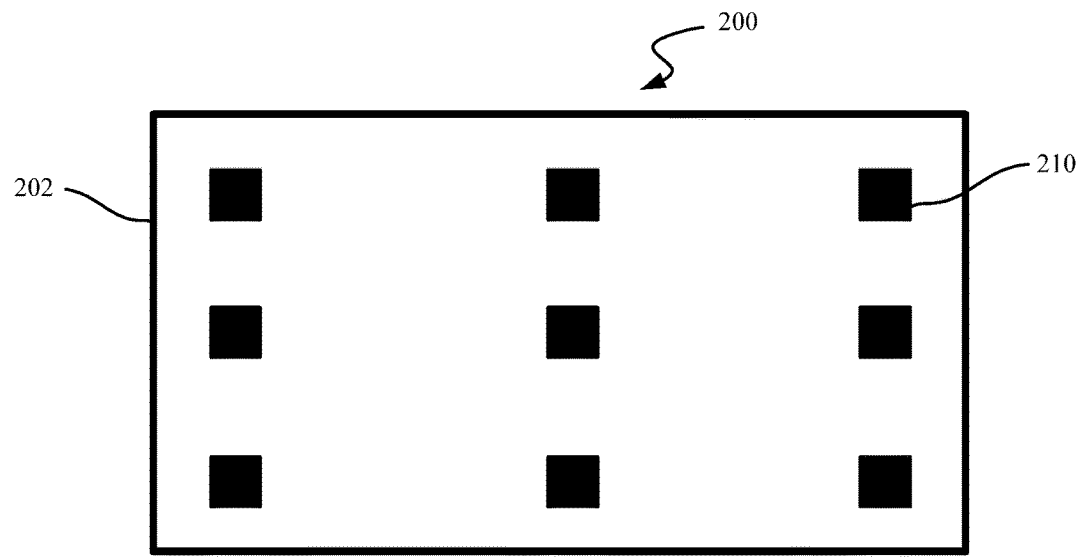
FIG. 2B schematically shows a bottom view of the lighting assembly shown in FIG. 2A.

FIG. 2B schematically shows a bottom view of the lighting assembly 200 shown in FIG. 2A.

Referring to FIG. 2B, each of the electrode regions 210 is shown as a black block on the substrate 202. The first external electrode 212 and the second external electrode 214 (not shown in FIG. 2B) in the electrode region 210 are typically made of an opaque metallic material to provide good electrical conductivity. Although the lighting assembly 200 is subjected to a certain loss of the light emitting area, it is provided with improved brightness uniformity since the respective electrode regions 210 are now arranged within the light emitting region 220 and thus provide more equal current transmission paths to various locations of the light emitting region 220. A uniform current distribution can further provide a uniform thermal distribution, so as to provide the possibility of omitting the thermally conductive material in the lighting assembly. This is especially true for embodiments where the plurality of electrode regions 210 are uniformly arranged in the light emitting region 220 as shown in FIG. 2A. In addition, the lighting assembly 200 has an insignificant periphery because there is no electrode region around the light emitting region 220 at the edge of the lighting assembly 200. This provides more design options, such as in applications where lighting panels are required to be "seamlessly" stitched.

Figure 2C:
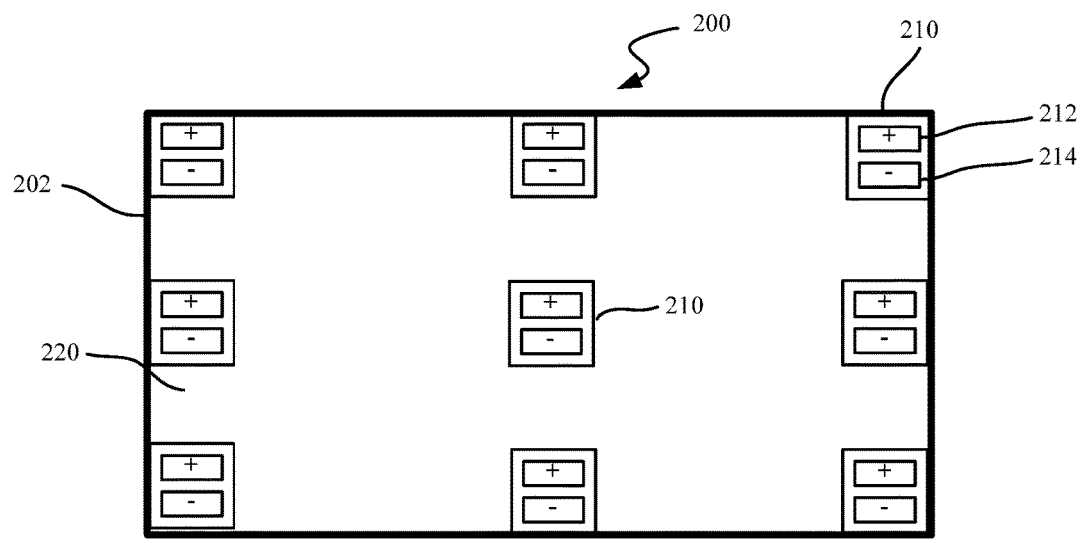
FIG. 2C schematically shows a variation of the arrangement of the electrode regions in the lighting assembly shown in FIG. 2A.

FIG. 2C schematically shows a variation of the arrangement of the respective electrode regions 210 in the lighting assembly 200 shown in FIG. 2A.

Referring to FIG. 2C, the respective electrode regions 210 located at the periphery of the substrate 202 are now moved "outwardly" to the edges of the substrate 202 as compared to the arrangement of FIG. 2A. In this case, the electrode region 210 at the center of the substrate 202 is surrounded by the light emitting region 220, and the electrode regions 210 at the edges of the substrate 202 are only partially surrounded by the light emitting region 220. For example, for the electrode region 210 located at the upper right corner of the substrate 202, the light emitting region 220 is arranged at only two side edges thereof.

The lighting assembly 200 shown in FIG. 2C has advantages similar to the lighting assembly shown in FIG. 2A. The electrode regions 210 provide relatively equal current transmission paths to various locations of the light emitting region 220 and there is still no electrode region around the light emitting region 220 at the edge of the lighting assembly 200.

Figure 2D:
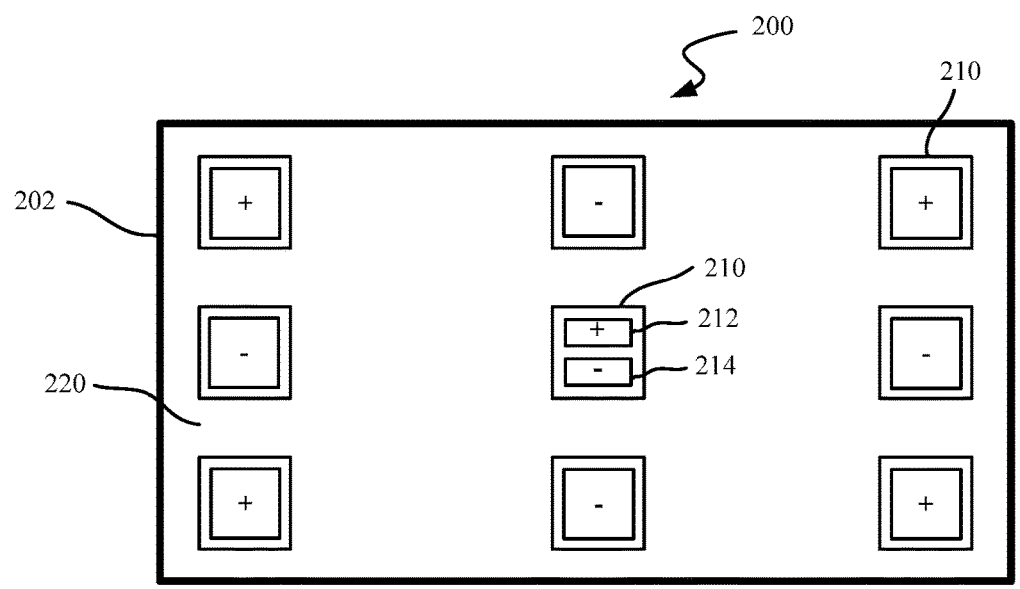
FIG. 2D schematically shows another variation of the arrangement of the electrode regions in the lighting assembly shown in FIG. 2A.

FIG. 2D schematically shows another variation of the arrangement of the electrode regions in the lighting assembly shown in FIG. 2A.

Referring to FIG. 2D, the electrode region 210 at the center of the substrate 202 includes both the first external electrode 212 and the second external electrode 214, and the remaining electrode regions 210 each include only the first external electrode 212 or the second external electrode 214.

In other words, each of the electrode regions 210 includes at least one of the first external electrode 212 and the second external electrode 214.

Other embodiments are possible. For example, the electrode region 210 at the center of the substrate 202 may include only the first external electrode 212 or the second external electrode 214. For another example, a single electrode region 210 may even include more than one first external electrode 212 and/or more than one second external electrode 214. Where appropriate, the number of the first external electrodes 212 may or may not be equal to the number of the second external electrodes 214 as long as the first surface is provided with at least one first external electrode 212 and at least one second external electrode 214.

The lighting assembly 200 shown in FIG. 2D has advantages similar to the lighting assembly shown in FIG. 2A. The electrode regions 210 provide relatively equal current transmission paths to various locations of the light emitting region 220 and there is still no electrode region around the light emitting region 220 at the edge of the lighting assembly 200.

Figure 3A:
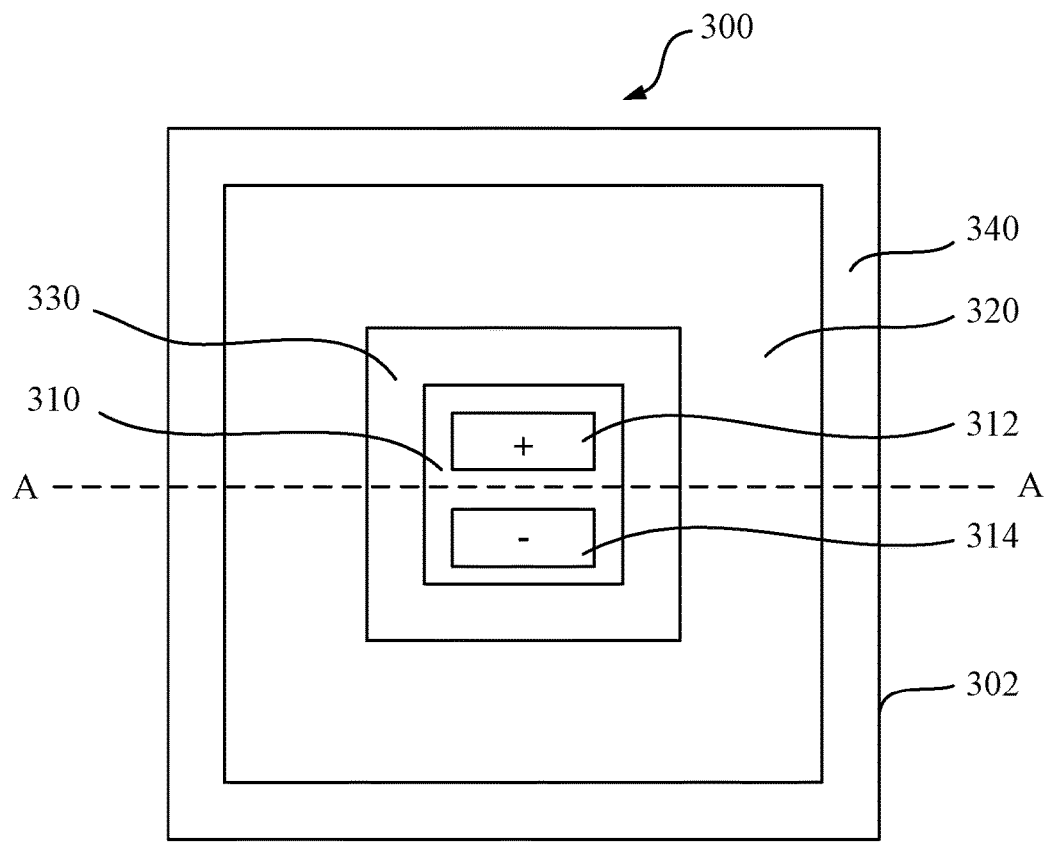
FIG. 3A schematically shows a plan view of a lighting assembly according to an embodiment of the present disclosure.

FIG. 3A schematically shows a plan view of a lighting assembly 300 according to an embodiment of the present disclosure.

Referring to FIG. 3A, the lighting assembly 300 includes a substrate 302, an electrode region 310, and a light emitting region 320 surrounding the electrode region 310. In this exemplary embodiment, the lighting assembly 300 includes only one electrode region 310, although a greater number of electrode regions are possible. The electrode region 310 includes a first external electrode 312 and a second external electrode 314 insulated from each other.

As compared to the lighting assembly 200 shown in FIG. 2A, the lighting assembly 300 further includes a first encapsulation region 330 arranged on the first surface of the substrate 302 and positioned between the electrode region 310 and the light emitting region 320, and a second encapsulation region 340 arranged on the first surface and surrounding the light emitting region 320. The first encapsulation region 330 and the second encapsulation region 340 may function to provide isolation and encapsulation of the light emitting region 320 (discussed below). It will be appreciated that although the first encapsulation region 330 and the second encapsulation region 340 are shown as having a certain width, their width in practice may be negligible relative to the size of the electrode region 310 and the light emitting region 320. The first encapsulation region 330 and the second encapsulation region 340 may become considerably insignificant if the light emitting region 320 emits light.

Figure 3B:
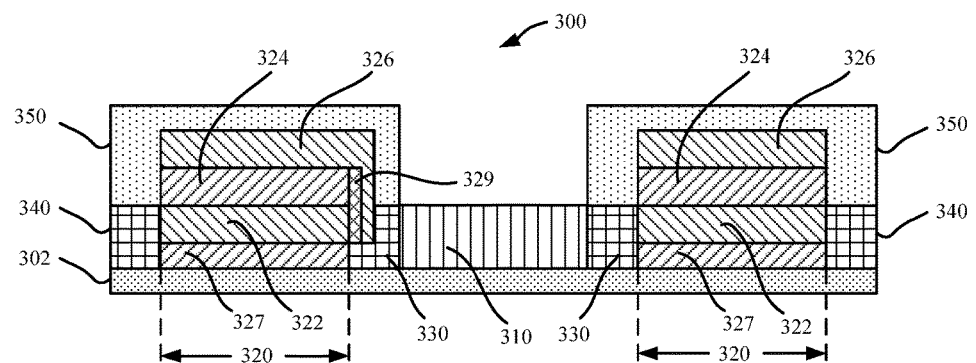
FIG. 3B schematically and exemplarily shows a cross-sectional view of the lighting assembly shown in FIG. 3A taken along line A-A.

FIG. 3B schematically and exemplarily shows a cross-sectional view of the lighting assembly 300 shown in FIG. 3A taken along line A-A.

Referring to FIG. 3B, the light emitting region 320 includes a first electrode layer 322, an electroluminescent layer 324, and a second electrode layer 326 sequentially arranged in a direction away from the substrate 302. The electroluminescent layer 324 may include an organic electroluminescent material, a quantum dot material, or any other suitable electroluminescent material. In general, the first electrode layer 322 is formed as an anode, and the second electrode layer 326 is formed as a cathode. In embodiments in which the electroluminescent layer 324 comprises an organic electroluminescent material, the first electrode layer 322 may be made of a material such as indium tin oxide (ITO), and the second electrode layer 326 may be made of metal having a good conductivity. In this case, the light emitting region 320 is configured as a bottom emission type, i.e., light emitted from the light emitting region 320 exits from the bottom surface of the substrate 302. However, other embodiments are possible. For example, the light emitting region 320 may be configured as a top emission type in which the first electrode layer 322 may be made of metal and the second electrode layer 326 may be made of a transparent conductive material. In addition, in embodiments in which the electroluminescent layer 324 includes an organic electroluminescent material, the light emitting region 320 may further include a hole injection layer and a hole transmission layer arranged between the first electrode layer 322 and the electroluminescent layer 324, and an electron transport layer arranged between the electroluminescent layer 324 and the second electrode layer 326.

The first electrode layer 322 is electrically connected to the first external electrode 312 (not shown in FIG. 3B) in the electrode region 310, and the second electrode layer 326 is electrically connected to the second external electrode 314 (not shown in FIG. 3B) in the electrode region 310. The electrical connections may be provided using various techniques known in the art. In the example of FIG. 3B, the lighting assembly 300 includes a wire layer 327 arranged below the first electrode layer 322. The first electrode layer 322 may be connected to the first external electrode in the electrode region 310 through a wire in the lead layer 327. The second electrode layer 326 has a portion extending to the wire layer 327 and is connected to the second external electrode in the electrode region 310 through a wire in the lead layer 327. An insulating material 329 provides insulation between the extending portion of the second electrode layer 326 and the first electrode layer 322.

The lighting assembly 300 further includes an encapsulation structure 350 that is formed on the first encapsulation region 330, the light emitting region 320, and the second encapsulation region 340 to provide encapsulation of the light emitting region 320. As is known, the encapsulation structure 350 may be formed by cover encapsulation or thin film encapsulation. In the cover encapsulation, the encapsulation structure 350 may include a cover plate made of a material such as glass or metal over the light emitting region 320 and a sealant for connecting the cover plate and the encapsulation regions 330, 340. In the thin film encapsulation, the encapsulation structure 350 may include a thin film formed from any suitable inorganic, organic or inorganic/organic composite encapsulating material. In some embodiments, the encapsulation structure 350 may even be integrally formed with the first encapsulation region 330 and the second encapsulation region 340.

As shown in FIG. 3B, the light emitting region 320 occupies a region of the first surface of the substrate 302 other than the first encapsulation region 330, the second encapsulation region 340, and the electrode region 310. This provides the largest possible luminous area.

Figure 4:
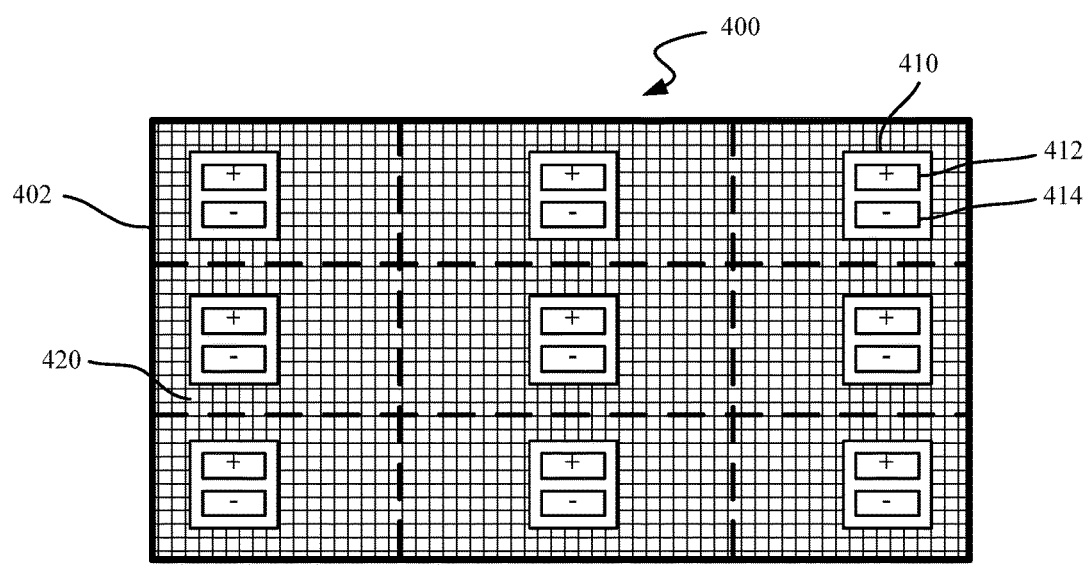
FIG. 4 schematically shows a plan view of a lighting assembly according to an embodiment of the present disclosure.

FIG. 4 schematically shows a plan view of a lighting assembly 400 according to an embodiment of the present disclosure.

Referring to FIG. 4, the lighting assembly 400 includes a substrate 402, a plurality of electrode regions 410, and a light emitting region 420. In this exemplary embodiment, each of the electrode regions 410 is shown as including a first external electrode 412 and a second external electrode 414 that are insulated from each other, although other electrode region configurations are possible.

The first electrode layer in the light emitting region 420 may include a plurality of individual sub-blocks (as indicated by the grid lines in FIG. 4), and the second electrode layer may be a continuous layer. This can be achieved by patterning the first electrode layer and referred to as "pixelization". Each sub-block forms a pixel, and typically has a size of, for example, 0.5 mm×0.5 mm. The pixelization of the light emitting region may avoid the problem that a local short circuit leads to the failure of the entire light emitting region. Alternatively, the second electrode layer in the light emitting region 420 may be pixelized into a plurality of sub-blocks, and the first electrode layer may be a continuous layer. Alternatively, the first electrode layer and the second electrode layer may each be pixelized into a plurality of sub-blocks.

In some examples, the sub-blocks of the electrode layers may be grouped into at least one block, as indicated by the intersecting dashed lines in FIG. 4. In this figure, the sub-blocks of the first and/or second electrode layers are grouped into nine blocks. The sub-blocks within each block may be connected in parallel, in series or in series-parallel.

In embodiments where the first electrode layer is pixelized into a plurality of sub-blocks, each block may be powered via a respective one of the first external electrodes 412 in the electrode regions 410. This provides relatively equal current transmission paths to the respective pixels such that powering to each block is individually controllable. Thus, options for selectively illuminating one or more areas in the light emitting region 420 can be provided by means of a lighting driving circuit arranged in e.g. a lamp holder, thereby realizing various applications. This is equally applicable for the electrode region configuration as shown in FIG. 2D.

Similarly, in embodiments in which the second electrode layer is pixelized into a plurality of sub-blocks, each block may be powered via a respective one of the second external electrodes 414 in the electrode regions 410 such that powering to each block is individually controllable. In embodiments in which the first electrode layer and the second electrode layer are each pixelized into a plurality of sub-blocks, the plurality of sub-blocks of the first and second electrode layers are grouped into at least one pair of blocks (i.e., pairing of a first electrode block and a second electrode block) and each pair of blocks is powered by a respective one of the first external electrodes 412 and a respective one of the second external electrodes 414 such that powering to each pair of blocks is individually controllable.

FIGS. 5A-5E schematically show a plan view of various variations of the layout of the electrode regions 510 of the lighting assembly 500 according to an embodiment of the present disclosure.

Figure 5A:
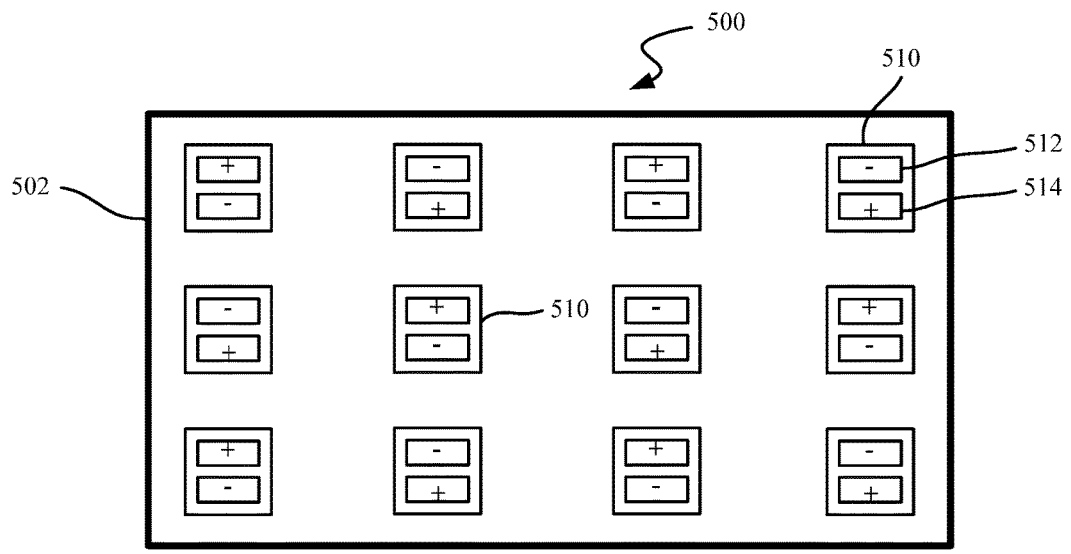
FIGS. 5A-5E schematically show a plan view of various variations of the layout of the electrode regions of a lighting assembly according to an embodiment of the present disclosure.
Figure 5B:
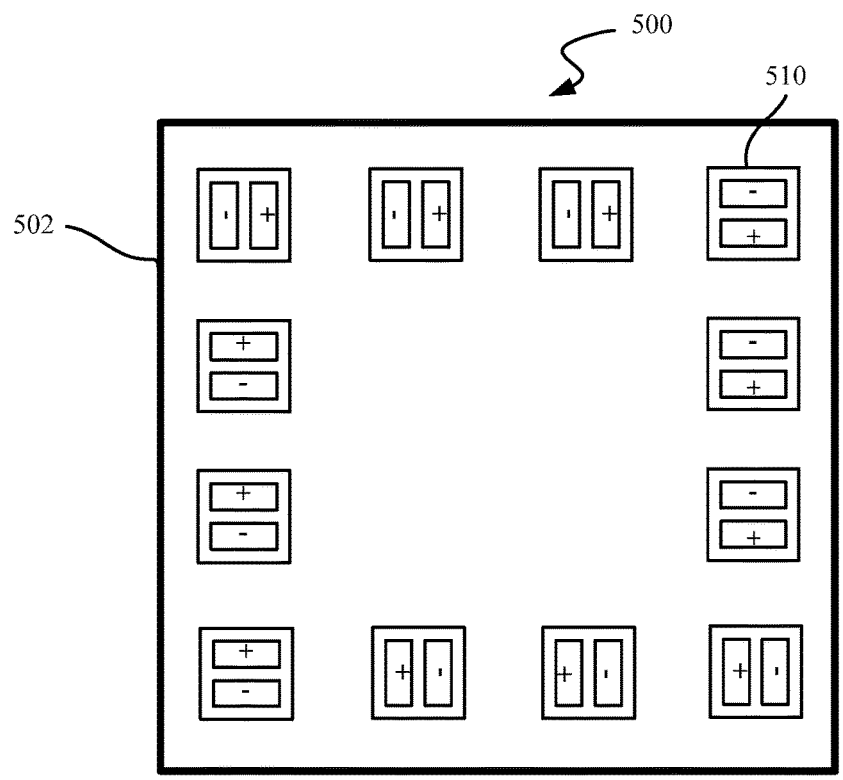
Figure 5C:
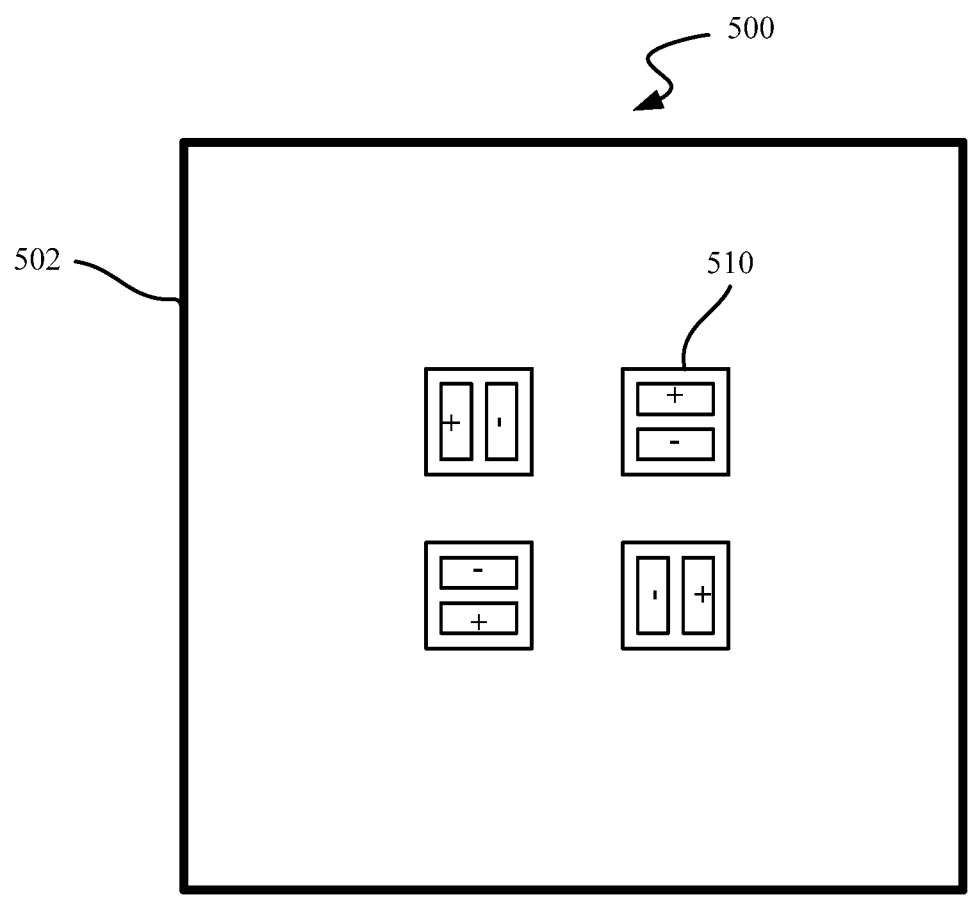
Figure 5D:
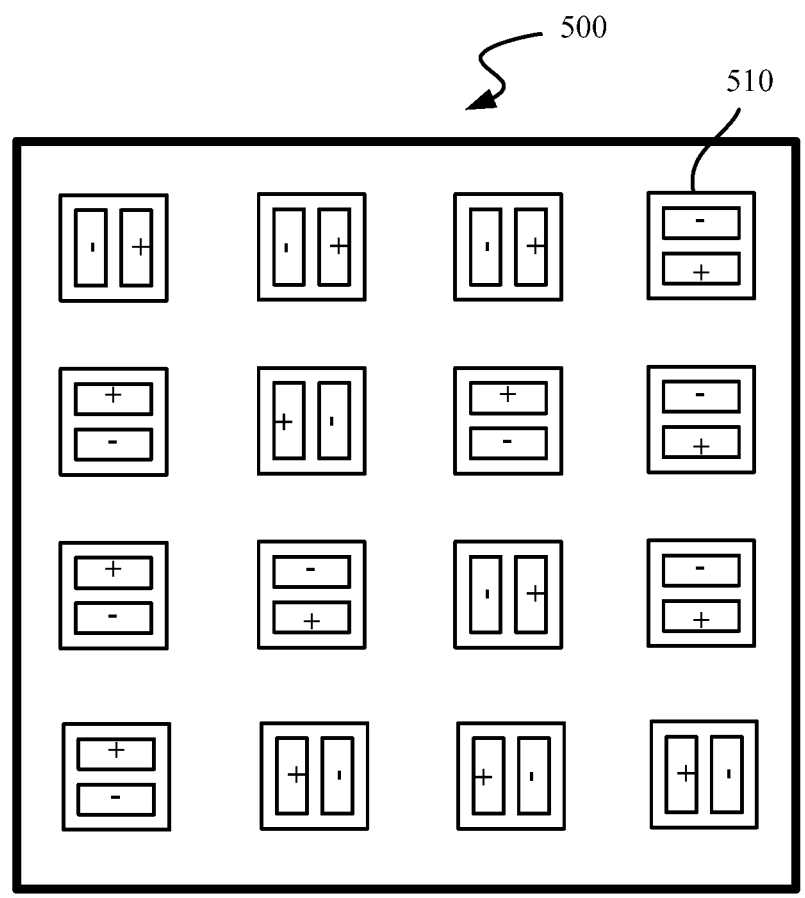
Figure 5E:
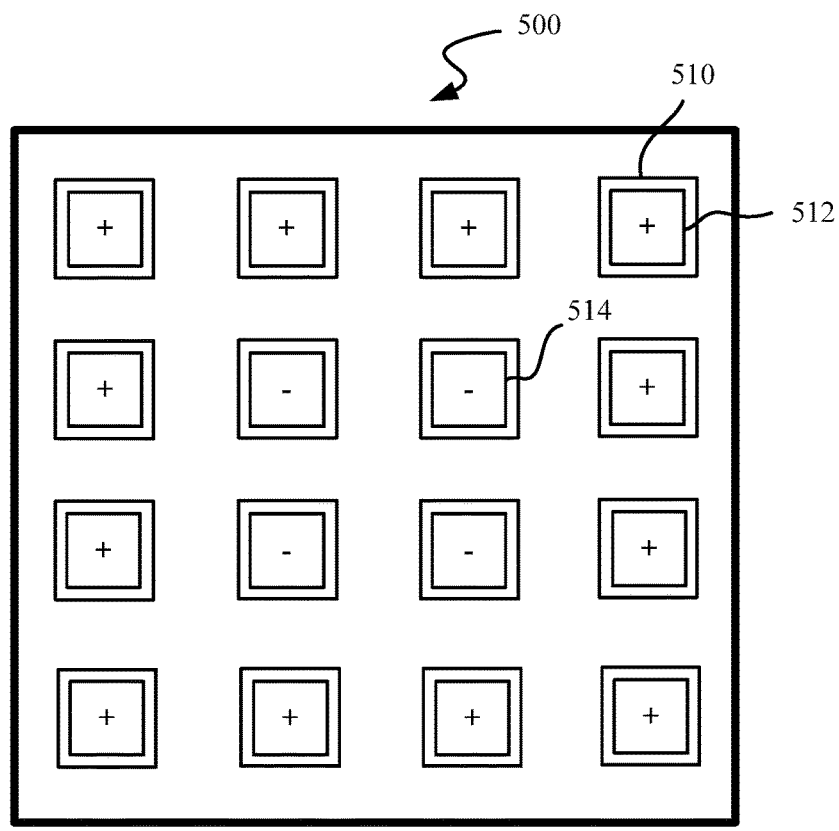

As shown in FIG. 5A, the plurality of electrode regions 510 and the first external electrode 512 and the second external electrode 514 in each of the electrode regions 510 are arranged such that a pattern formed by the plurality of electrode regions 510 is rotationally symmetrical with respect to a center of the first surface of the substrate 502. For example, when the substrate 502 is rotated by 180 degrees clockwise or counterclockwise, the pattern formed by the plurality of electrode regions 510 coincides with the pattern before the rotation. This may prevent the first external electrode 512 and the second external electrode 514 from being reversed when the lighting assembly 500 is mounted to an external circuit such as a lamp holder, since the lighting assembly 500 can now be mounted without taking into account the orientation of the substrate 502.

FIGS. 5B-5E show further variations of the layout of the electrode regions 510. In the lighting assembly 500 shown in FIG. 5B, the substrate 502 has a square shape, and the pattern formed by the plurality of electrode regions 510 is rotationally symmetric about the center of the first surface of the substrate 502. In the lighting assembly 500 shown in FIG. 5C, the pattern formed by the plurality of electrode regions 510 is still rotationally symmetric with respect to the center of the first surface of the substrate 502. In the lighting assembly 500 shown in FIG. 5D, the pattern formed by the plurality of electrode regions 510 is a combination of the patterns shown in FIGS. 5B and 5C. In the lighting assembly 500 shown in FIG. 5E, each of the electrode regions 510 includes only one of the first external electrode 512 and the second external electrode 514, but the pattern formed by these electrode regions 510 is still rotationally symmetrical with respect to the center of the first surface of the substrate 502.

It will be appreciated that the electrode region layouts shown in FIGS. 5A-5E are exemplary and that other layouts of the electrode region are possible that are rotationally symmetrical.

Figure 6:
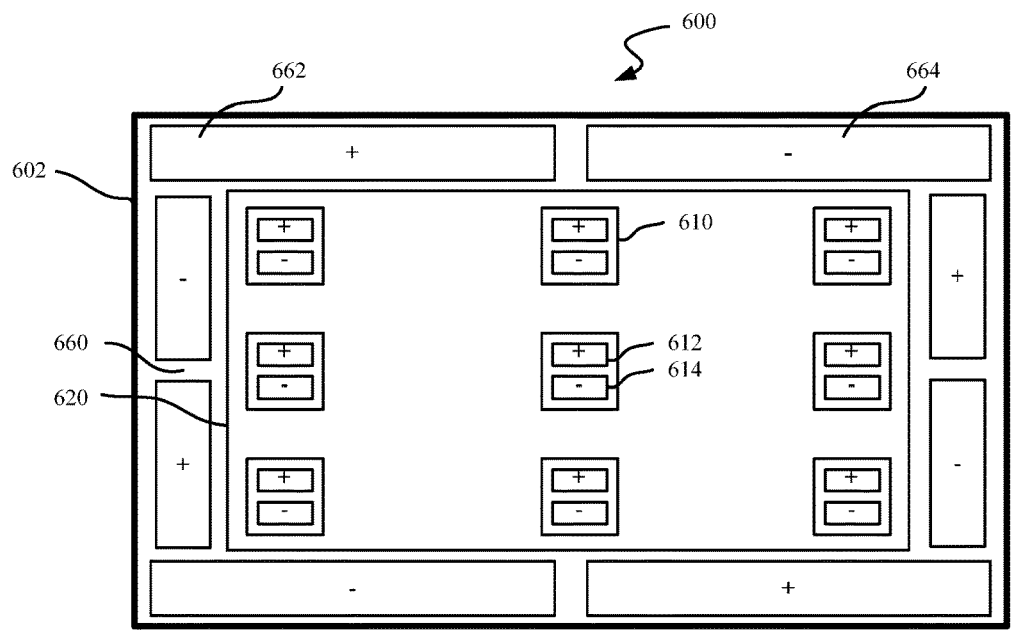
FIG. 6 schematically shows a plan view of a lighting assembly according to an embodiment of the present disclosure.

FIG. 6 schematically shows a plan view of a lighting assembly 600 according to an embodiment of the present disclosure.

Referring to FIG. 6, the first surface of the substrate 602 has a light emitting region 620 in which electrode regions 610 are arranged and an additional region 660 in which additional external electrodes 662, 664 are arranged. This may be advantageous because the lighting assembly 600 may be provided with further improved brightness uniformity. In this exemplary embodiment, each of the electrode regions 610 is shown as including a first external electrode 612 and a second external electrode 614 that are insulated from each other, although other electrode region configurations are possible.

In some embodiments, the region 660 does not necessarily surround the light emitting region 620. For example, the region 660 may be arranged only at one side of the light emitting region 620. In some embodiments, the external electrodes 662, 664 may have the same form factor as the external electrodes 612, 614 in the electrode region 610. In some embodiments, the region 660 may include more or less external electrodes 612, 614.

It will be understood that the individual embodiments described above in connection with the accompanying drawings may be combined where appropriate. For example, the various electrode region layouts shown in FIGS. 5A-5E may be applied to the lighting assembly 400 shown in FIG. 4. In addition, the substrate (and thus the light emitting region) and the electrode regions may have other shapes, such as circular, triangular, or any other desired shapes.

According to a second aspect of the present disclosure, there is provided a lighting device such as a lamp. The lighting device may include the lighting assembly as described in any one of the preceding embodiments or combinations thereof.

Various modifications, adaptations to the foregoing exemplary embodiments of this disclosure may become apparent to those skilled in the relevant arts in view of the foregoing description, when read in conjunction with the accompanying drawings. Any and all modifications will still fall within the scope of the non-limiting and exemplary embodiments of this disclosure. Furthermore, other embodiments of the disclosures set forth herein will come to mind to one skilled in the art to which these embodiments of the disclosure pertain having the benefit of the teachings presented in the foregoing descriptions and the associated drawings.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A lighting assembly comprising:
a substrate having a first surface;
a plurality of electrode regions arranged on the first surface, wherein each electrode region comprises at least one of a first external electrode and a second external electrode such that the first surface is provided with at least one first external electrode and at least one second external electrode, the first external electrode and the second external electrode being insulated from each other; and
a light emitting region arranged on the first surface and surrounding all of the plurality of electrode regions, wherein the light emitting region comprises a first electrode layer, an electroluminescent layer, and a second electrode layer arranged sequentially in a direction away from the substrate, wherein the first electrode layer is electrically connected to the first external electrode, and wherein the second electrode layer is electrically connected to the second external electrode.

2. The lighting assembly of claim 1, further comprising:
a first encapsulation region arranged on the first surface and positioned between the at least one surrounded electrode region and the light emitting region;
a second encapsulation region arranged on the first surface and surrounding the light emitting region; and
an encapsulation structure formed on the first encapsulation region, the light emitting region, and the second encapsulation region to provide encapsulation of the light emitting region.

3. The lighting assembly of claim 2, wherein the light emitting region occupies a region of the first surface other than the first encapsulation region, the second encapsulation region, and the plurality of electrode regions.

4. The lighting assembly of claim 1, wherein the first electrode layer comprises a plurality of individual sub-blocks.

5. The lighting assembly of claim 4, wherein the plurality of sub-blocks is grouped into at least one block, wherein each block is powered via a respective one of the at least one first external electrode such that powering to each block is individually controllable.

6. The lighting assembly of claim 1, wherein the second electrode layer comprises a plurality of individual sub-blocks.

7. The lighting assembly of claim 6, wherein the plurality of sub-blocks is grouped into at least one block, wherein each block is powered via a respective one of the at least one second external electrode such that powering to each block is individually controllable.

8. The lighting assembly of claim 1, wherein the first electrode layer and the second electrode layer each comprise a plurality of individual sub-blocks.

9. The lighting assembly of claim 8, wherein the plurality of sub-blocks of the first and second electrode layers are grouped into at least one pair of blocks, wherein each pair of blocks is powered via a respective one of the at least one first external electrode and a respective one of the at least one second external electrode such that powering to each pair of blocks is individually controllable.

10. The lighting assembly of claim 1, wherein the plurality of electrode regions are evenly distributed over the first surface.

11. The lighting assembly of claim 1, wherein the plurality of electrode regions are arranged such that a pattern formed by the plurality of electrode regions is rotationally symmetric with respect to a center of the first surface.

12. The lighting assembly of claim 1, wherein the first electrode layer is an anode, and wherein the second electrode layer is a cathode.

13. The lighting assembly as claimed in claim 1, wherein the electroluminescent layer comprises an organic electroluminescent material or a quantum dot material.

14. A lighting device comprising the lighting assembly as claimed in claim 1.

15. A lighting device comprising the lighting assembly as claimed in claim 2.

16. A lighting device comprising the lighting assembly as claimed in claim 3.

17. A lighting device comprising the lighting assembly as claimed in claim 4.

18. A lighting device comprising the lighting assembly as claimed in claim 5.

19. A lighting device comprising the lighting assembly as claimed in claim 6.

20. A lighting device comprising the lighting assembly as claimed in claim 7.

* * * * *